United States Patent [19]
Shahani et al.

[11] Patent Number: 6,084,285
[45] Date of Patent: Jul. 4, 2000

[54] LATERAL FLUX CAPACITOR HAVING FRACTAL-SHAPED PERIMETERS

[75] Inventors: Arvin R. Shahani, Mountain View; Thomas H. Lee, Cupertino; Hirad Samavati; Derek K. Shaeffer, both of Stanford; Steven Walther, Mountain View, all of Calif.

[73] Assignee: The Board of Trustees of the Leland Stanford Junior University, Palo Alto, Calif.

[21] Appl. No.: 08/954,973

[22] Filed: Oct. 20, 1997

[51] Int. Cl.$^7$ ....................................................... H01L 29/41
[52] U.S. Cl. ........................... 257/532; 257/534; 438/393
[58] Field of Search ...................................... 257/532, 534, 257/535; 438/393, 250

[56] References Cited

U.S. PATENT DOCUMENTS

| | | | |
|---|---|---|---|
| 5,444,600 | 8/1995 | Dobkin et al. | 361/303 |
| 5,447,067 | 9/1995 | Biebl et al. | 257/417 |
| 5,589,709 | 12/1996 | Dobkin et al. | 257/666 |
| 5,777,532 | 7/1998 | Lakin | 333/161 |
| 5,828,106 | 10/1998 | Sato | 257/350 |

OTHER PUBLICATIONS

IBM Technical Disclosure Bulletin, vol. 33, No. 10A, Mar. 1991, p. 424, "Decoupling Capacitor Incorporated in Printed Circuit Board."

*Primary Examiner*—David B. Hardy
*Attorney, Agent, or Firm*—Flehr Hohbach Test Albritton & Herbert LLP

[57] ABSTRACT

Linear integrated circuit capacitors having greater capacitance per unit area by using lateral flux. One embodiment comprises a two metal layer capacitor wherein each metal layer is comprised of two capacitor conductive components. The capacitor conductive components are cross-coupled so that the total capacitance is the sum of the vertical flux between the metal layers, and the lateral flux along the edges between the two capacitor conductive components in each of the metal layers. The lateral flux between the capacitor conductive components in a single metal layer increases the capacitance per unit area and decreases the bottom-plate parasitic capacitance. Increasing the length of the common edge formed by capacitor conductive components in a metal layer increases the capacitance per unit area. In one lateral flux capacitor, each metal layer is comprised of a plurality of rows, alternate rows are coupled together such that lateral flux is generated between each of the rows. The rows are also cross-coupled with rows in adjacent metal layers to provide vertical flux. Fractal shapes can be used to maximize the length of the perimeter of adjacent capacitor conductive components in a single metal layer. The Koch Islands and Minkowski Sausage families of fractals are particularly well suited for generating capacitor conductive component perimeter shapes. These fractals are generated by selecting an initiator shape and repeatedly applying a generator. The fractal shapes are generated by a computer program based upon user input parameters.

17 Claims, 10 Drawing Sheets

INITIATOR:
M=4

GENERATOR:
N=8, r=1/4, D=log(N)/log(1/r)=1.5

INITIATOR:
M=12

LATERAL FLUX CAPACITOR HAVING FRACTAL-SHAPED PERIMETERS

FIELD OF THE INVENTION

This invention relates generally to integrated circuits and more particularly to integrated circuit capacitors that use lateral electric fields, in addition to vertical electric fields, to provide capacitance.

BACKGROUND OF THE INVENTION

Reductions in the minimum lithographic dimension of integrated circuit fabrication processes have made the space required for linear capacitors disproportionately large relative to other circuit components. The following background is provided to more thoroughly describe this problem.

Capacitors are used extensively in integrated circuits. Linear capacitors with small voltage dependence are essential in many applications including analog to digital and digital to analog converters, sample and holds and phase locked loops. A capacitor is linear if the value of the capacitance does not depend on voltage. The cost of an integrated circuit for a given manufacturing process is directly related to the size of the integrated circuit die. In recent years a wide range of technological developments have been made to reduce the minimum lithographic dimension of integrated circuits. An important feature of a capacitor is its quality factor, Q. Q is inversely proportional to the series resistance of a capacitor, and is therefore a measure of the quality of a capacitor.

Traditionally three different types of capacitors are used in integrated circuits: junction capacitors, metal-oxide-semiconductor (MOS) capacitors, and metal to metal/polysilicon (poly) capacitors. Junction capacitors simply comprise a junction between a p-type semiconductor and an n-type semiconductor. The junction capacitor is therefore similar to a diode, however, typically a much larger area is used. When the junction is reverse biased, the depletion layer forms the dielectric, and the p and n regions on either side form the capacitor plates. The requirement that the junction must always be reverse biased severely limits the interconnection flexibility of the device. Also the width of the depletion layer is voltage dependent, making the capacitance nonlinear. Further drawbacks of junction capacitors include that they are sensitive to process variations, they have a low Q factor, and they have a large temperature coefficient.

MOS capacitors a essentially an expanded gate structure of a MOS transistor. MOS capacitors provide high capacitance per unit area. However, drawbacks of MOS capacitors include that they are nonlinear, they require a DC bias voltage, they have a low break-down voltage, and they only have a medium Q factor.

Metal to metal capacitors typically comprise two metal layers separated by a dielectric. Alternatively, polysilicon may be substituted for metal. A block diagram of a conventional parallel plate capacitor is illustrated in FIG. 1. Metal to metal capacitors provide linear operation, a high Q factor, and a small temperature coefficient. These features make metal to metal capacitors the preferred type of capacitor for many integrated circuit applications. However, metal to metal capacitors have a relatively low capacitance per unit area. Therefore capacitors are often required that take up large areas on an integrated circuit. Such large capacitors can significantly increase the cost of an integrated circuit. The capacitance of a parallel plate capacitor, such as capacitor 100, is provided by the formula.

$$C = \varepsilon \frac{A}{d}$$

where $\varepsilon$ is the permittivity of the dielectric material separating the plates, A is the area of the capacitor plates, and d is the distance between the plates. Technological developments have provided substantial reductions in the minimum horizontal spacing in integrated circuits, and substantial further reductions are expected. However, the distance between layers in an integrated circuit has not been comparably reduced. As a result, metal to metal capacitors continue to require large areas to provide desired capacitance values. Further the relative size of conventional capacitors compared to other circuit elements is likely to grow as horizontal spacing continues to be reduced. A further drawback of metal to metal capacitors is that they typically have a large parasitic bottom-plate capacitance due to their large areas. Parasitic bottom-plate capacitance is the undesirable capacitance between the lower plate of the capacitor and the integrated circuit substrate.

It is therefore an object of the present invention to provide a linear capacitor with increased capacitance per unit area and reduced parasitic bottom-plate capacitance.

SUMMARY OF THE INVENTION

The present invention provides linear integrated circuit capacitors having greater capacitance per unit area by using lateral flux. One embodiment comprises a two metal layer capacitor wherein each metal layer contains each of the two capacitor conductive components. The capacitor conductive components are cross-coupled so that the total capacitance is the sum of the vertical flux between the metal layers, and the lateral flux along the edges between the two capacitor conductive components in each of the metal layers. The lateral flux between the capacitor conductive components in a single metal layer increases the capacitance per unit area and decreases the bottom-plate parasitic capacitance.

Because capacitance is proportional to the capacitive area, increasing the length of the common edge formed by capacitor conductive components in a metal layer increases the capacitance per unit area. As used herein, capacitance per unit area refers to the capacitance per unit area of the die, or in other words the area in a plane parallel to the surface of the die. Whereas, the capacitive area of a lateral flux capacitor includes all of the regions between the capacitor conductive components which comprises areas parallel to the surface of the die, as well as areas perpendicular to the surface of the die. In a further embodiment of the present invention, each metal layer is comprised of a plurality of rows, alternate rows are coupled together such that lateral flux is generated between each of the rows. The rows are also cross-coupled with rows in adjacent metal layers to provide vertical flux.

Capacitors having capacitor conductive components with fractal shaped perimeters provide even greater capacitance per unit area. Fractal shapes can be used to maximize the length of the perimeter between adjacent capacitor conductive components in a single metal layer. The Koch Islands and Minkowski Sausage families of fractals are particularly well suited for generating capacitor conductive component perimeter shapes. These fractals are generated by selecting an initiator shape and repeatedly applying a generator. The fractal shapes are generated by a computer program based upon user input parameters. The capacitance is determined using a field solver. Fractals can be defined to generate capacitor shapes to fit available die space.

BRIEF DESCRIPTION OF THE DRAWINGS

The foregoing and other objects of the invention will be more fully understood from the following description read in connection with the accompanying drawings, of which.

DETAILED DESCRIPTION OF THE PREFERRED EMBODIMENTS

Figure 1:
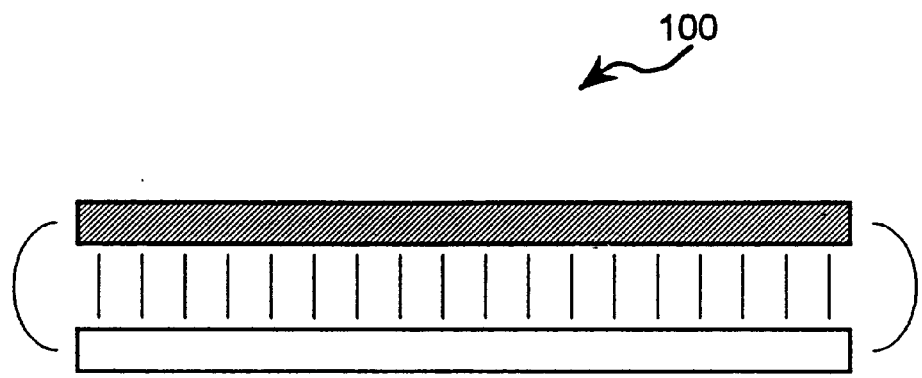
FIG. 1 illustrates a conventional parallel plate capacitor.
Figure 2A:
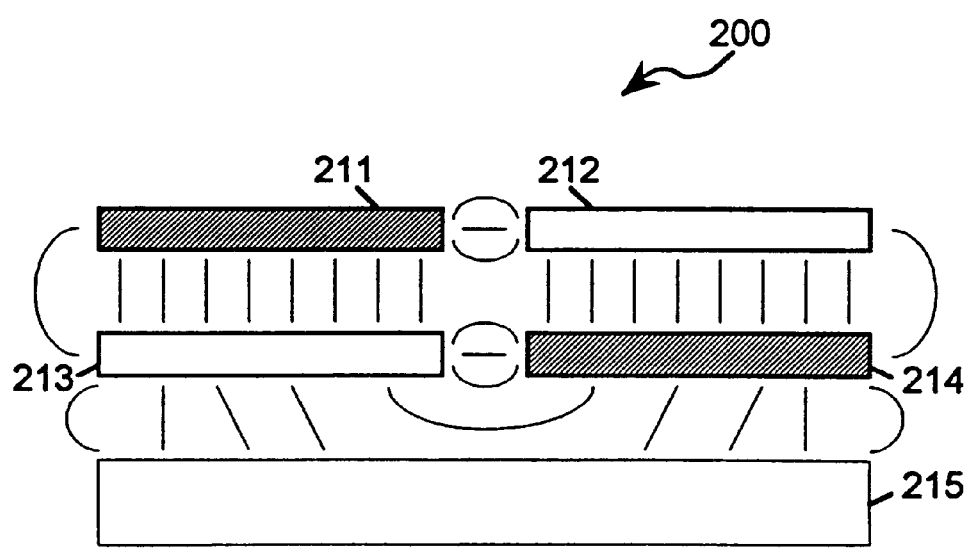
FIG. 2A illustrates a lateral flux capacitor 200 according to one embodiment of the present invention.

The present invention provides linear integrated circuit capacitors with increased capacitance per unit area by using lateral flux. FIG. 2A is a simplified block diagram of a cross section of a lateral flux integrated circuit capacitor 200 according to one embodiment of the present invention. Elements 211–214 are four conductive components of the capacitor. Each of the elements 211–214 may be formed by metal layer traces. Separating the top layer into two components 211 and 212 creates lateral electric field lines (flux) at the edges of the components. Similarly, lateral flux is also generated between the lower two components 213 and 214. The additional capacitance provided by these lateral flux regions when combined with the vertical flux between the upper components 211 and 212 and the lower components 213 and 214 provides a greater capacitance per unit area than a comparable conventional capacitor that is only comprised of two stacked conductive components and therefore only uses vertical flux. As used herein, capacitance per unit area refers to the capacitance per unit area of the die, or in other words the area in a plane parallel to the surface of the die.

Figure 2B:
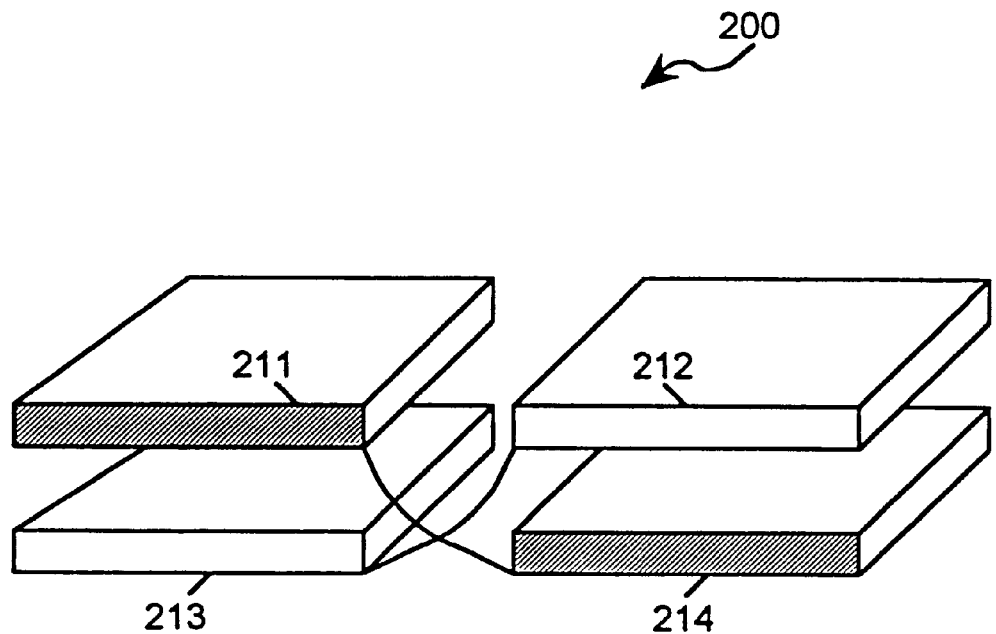
FIG. 2B illustrates an alternative view of lateral flux capacitor 200.

Whereas, the capacitive area of a lateral flux capacitor includes all of the regions between the capacitor conductive components which comprises areas parallel to the surface of the die, as well as areas perpendicular to the surface of the die. Lateral flux capacitor 200 is a cross coupled capacitor. Conductive components 211 and 214 are coupled, and conductive components 212 and 213 are also coupled, as is illustrated in FIG. 2B.

In addition to the increased capacitance per unit area, lateral flux capacitor 200 also reduces bottom-plate parasitic capacitance, and the capacitance of lateral flux capacitor 200 is linear. Bottom-plate parasitic capacitance is the undesirable capacitance between the bottom-plates 213 and 214 and the substrate 215. Bottom-plate parasitic capacitance can adversely affect the bandwidth of the circuit, and increases the capacitive loading, thereby reducing signal integrity. The reduction in bottom-plate capacitance is a valuable improvement for many applications including switched capacitor and RF circuits. Also, since the capacitance per unit area is increased, the percentage of parasitic capacitance relative to the total capacitance in lateral flux capacitors is smaller than in conventional vertical flux capacitors. Lateral flux capacitor 200 reduces the bottom-plate parasitic capacitance because some of the field lines terminate at the adjacent lower plate rather than on the substrate. By contrast in a conventional single lower plate vertical capacitor, all of the lower plate field lines terminate on the substrate.

Figure 3:
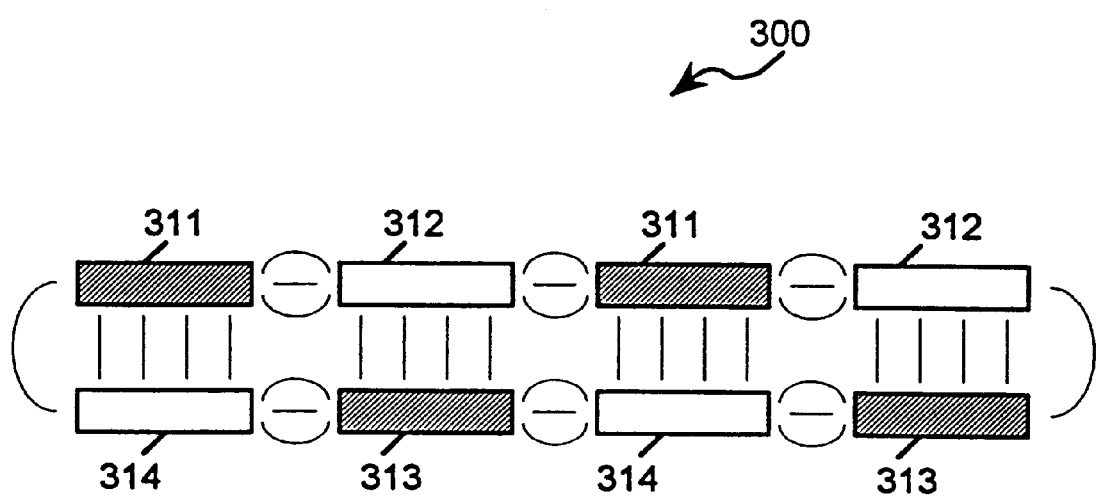
FIG. 3 illustrates a lateral flux capacitor 300 comprised of a plurality of sub-regions on each layer according to one embodiment of the present invention.

FIG. 3 illustrates a lateral flux capacitor 300 comprised of a plurality of sub-regions on each layer according to one embodiment of the present invention. Lateral flux capacitor 300 provides a higher capacitance per unit area than lateral flux capacitor 200 by increasing the length of the perimeter edge between the two conductive components on the same metal layer. Instead of using only two conductive components per metal layer as in lateral flux capacitor 200, lateral flux capacitor 300 uses four conductive components per layer. The capacitance of two parallel plates is described by the equation $$C = \varepsilon \frac{A}{d}$$

where $\varepsilon$ is the permittivity of the dielectric material separating the plates, A is the area of the capacitor conductive components, and d is the distance between the conductive components. Keeping other parameters constant, increasing the length of the total perimeter between the conductive components increases the capacitance. The conductive components 312 and 314 form a "plate 1" of the capacitor and are coupled together. The conductive components 311 and 313 form a "plate 2" of the capacitor and are also coupled together.

Figure 4:
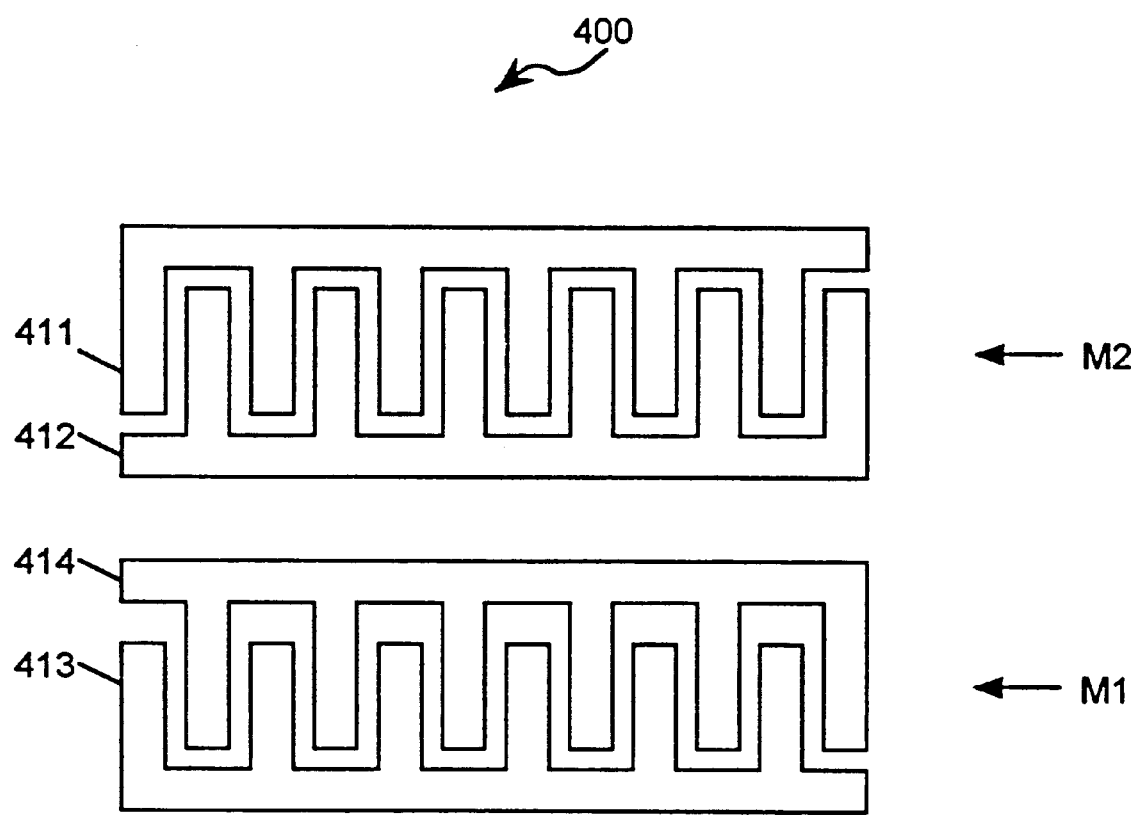
FIG. 4 illustrates two conductive components of a lateral flux capacitor 400 according to one embodiment of the present invention.

FIG. 4 illustrates two conductive components of a lateral flux capacitor 400. Lateral flux capacitor 400 is comprised of two metal layers. Each metal layer is comprised of a plurality of inter-digited rectangular sub-regions. In metal layer 2, the rectangular sub-regions alternate between conductive component 411 and conductive component 412. The adjacent edges of the capacitor conductive component regions can be formed into numerous shapes depending on the design parameters. Generally to optimize capacitor performance, one adjacent capacitor conductive component edge should have a predetermined configuration and the adjacent capacitor conductive component edge should form a predetermined complimentary configuration with a narrow uniform distance between the edges, as is illustrated for example in FIG. 4.

In an integrated circuit, metal layers 1 and 2 are aligned such that the conductive component 411 sub-regions in metal layer 2 are opposite the conductive component 413 sub-regions in metal layer 1. Similarly the conductive component 412 sub-regions in metal layer 2 are opposite the conductive component 414 sub-regions in metal layer 1. The two metal layers are separated by a dielectric. Conductive components 411 and 414 thereby form "plate 1" of the capacitor, and conductive components 412 and 413 form "plate 2" of the capacitor. Thus the total capacitance of capacitor 400 is the sum of the lateral flux based capacitance for each of the metal layers and the vertical flux based capacitance between the two layers.

The metal layers of the capacitor are coupled together using vias. In capacitor 400 vias can be placed along the long edges that form the interconnect between the sub-regions. Vias are generally placed so as to maximize the capacitance and minimize the parasitic resistance of the capacitor.

As illustrated by FIGS. 2, 3 and 4, the capacitance per unit area can be increased by increasing the length of the common edge between a first and second conductive component in a metal layer. The width of the metal strips in a capacitor's conductive components can be reduced down to the minimum dimension of the fabrication process being used. Using minimum width metal traces can provide large increases in the capacitance per unit area, however, narrow traces also increase the parasitic resistance of the capacitor. Higher parasitic resistance decreases the quality factor, Q, of the capacitor. There is therefore a tradeoff between increasing the capacitance per unit area by using narrow traces, and increasing the parasitic resistance. Lateral flux capacitors thus provide another degree of freedom in the design process. Lateral flux capacitors can provide several times the capacitance per unit area of a conventional parallel plate capacitor. For example, some embodiments provide increases in capacitance per unit area of two to six times that of a conventional parallel plate capacitor. In applications that require a capacitor with low parasitic resistance, a lower capacitance per unit area may be more appropriate using larger traces, for example twice the capacitance per unit area of conventional parallel plate capacitors.

Figure 5:
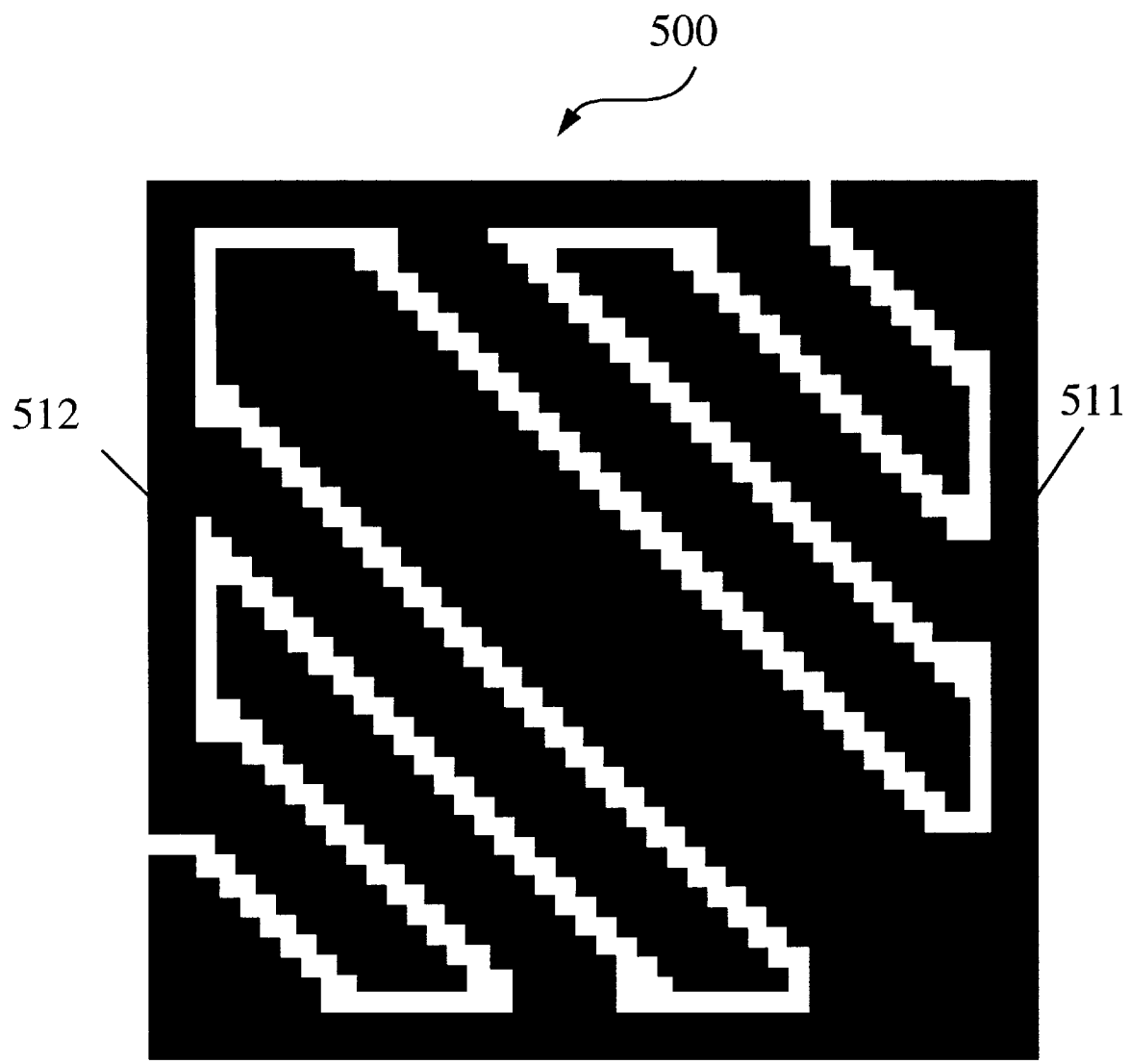
FIG. 5 illustrates a lateral flux capacitor section 500 comprising a plurality of diagonal conductive component sub-regions according to one embodiment of the present invention.

FIG. 5 illustrates a lateral flux capacitor section 500 comprising a plurality of diagonal conductive component sub-regions according to one embodiment of the present invention. The ends of each of the diagonal sub-regions are shaped to parallel the adjacent edge of the cell. The section 500 illustrated can be flipped across the X-axis, and then both of those sections flipped across the Y-axis to form a unit cell four times the size of section 500. This unit cell can then be arrayed to form an integrated circuit capacitor having the desired capacitance. A simulation of one such unit cell using a 0.35 μm process was determined to have a capacitance of 37 fF. By contrast a conventional parallel plate capacitor of the same area only had a capacitance of 20 fF. This demonstrates almost a factor of two improvement in the capacitance per unit area obtained by using lateral flux. Metal layers comprising arrays of the unit cell can also be stacked vertically, with each layer separated from adjacent layers by a dielectric to further increase the capacitance. The metal layers are coupled together using vias such that the conductive component 511 of one layer is coupled to the conductive component 512 of adjacent layers. This can then be repeated for as many metal layers as the semiconductor manufacturing process supports. For example, some semiconductor processes provide six metal layers. Other conductive materials besides metals can be used for the circuit layers, including for example, polysilicon.

Fractal Capacitors

Lateral flux increases proportionately to the length of the common perimeter formed by the edges of the two conductive components in a layer of a lateral flux capacitor. Maximizing the length of this perimeter thereby maximizes the capacitance per unit area. Certain fractals provide structures having infinite perimeter using a finite area. Fractals are therefore superb models for the conductive plates used in lateral flux capacitor layers.

Figure 6A:
FIGS. 6A and 6B illustrate the creation of an example of a Koch Islands fractal.
Figure 6B:
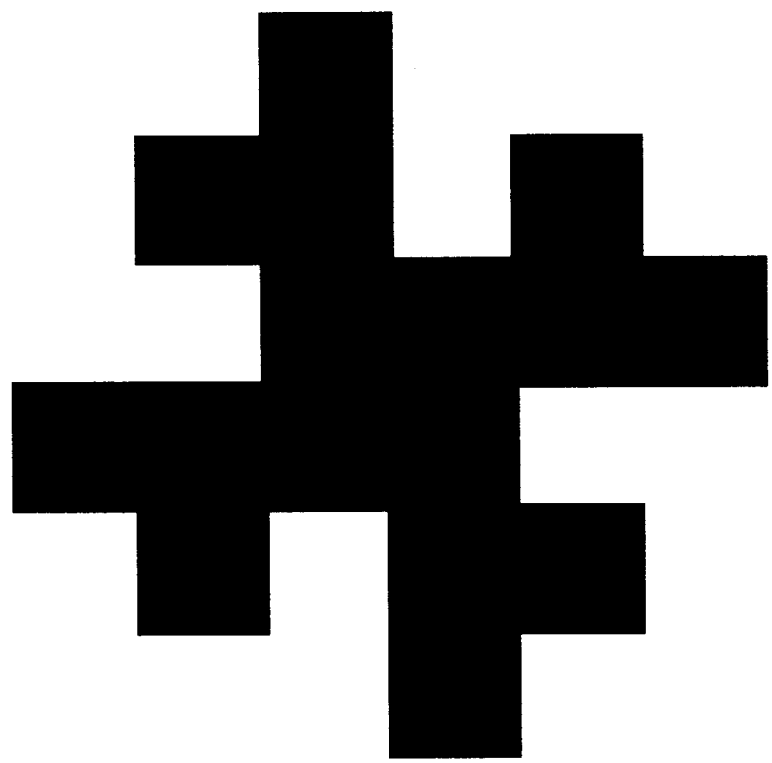
Figure 6C:
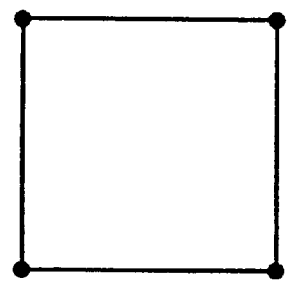
FIG. 6C illustrates an initiator that corresponds to the FIGS. 6A and 6B graphs.
Figure 6D:
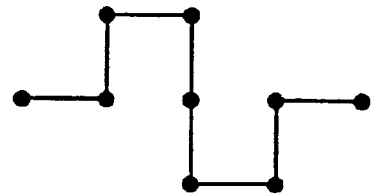
FIG. 6D illustrates a generator that corresponds to the FIGS. 6A and 6B graphs.
Figure 6E:
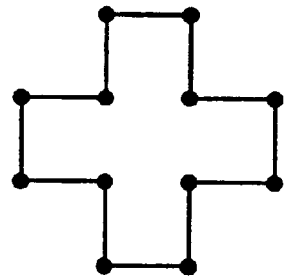
FIG. 6E illustrates an initiator according to a further embodiment of the present invention.

Fractals are mathematical structures defined by an algorithm or equation. Fractals can be created by starting with initial values and iteratively performing an algorithm. A fractal is comprised of the results of an infinite number of iterations of the algorithm Fractals are generally represented using computer graphics. The creation of a fractal, that is an example of a family of fractals called Koch Islands fractals, is illustrated in FIGS. 6A and 6B. The fractal is created by replacing each segment of an initiator shape with a curve called a generator. A characteristic feature of Koch Islands fractals is that they are created by starting with an initiator and then formed by repeatedly applying a generator. The iterative graphs illustrate early stages in the creation of the fractal. FIGS. 6C and 6D illustrate an example of an initiator and a generator that correspond to the FIGS. 6A and 6B iterative graphs. In the example of FIG. 6C, the initiator is a square having a value M=4. The FIG. 6D generator corresponds to the parameters N=8 and r=¼ where N is the number of segments, and r is one over the width of the generator in terms of the number of segments measured directly across the curve. FIG. 6E illustrates an initiator according to another embodiment of the present invention. The FIG. 6E initiator is a cross shape comprised of five unit squares, and has an M value of 12. There is a great deal of flexibility in the shapes that are defined for the initiator and generator, these two examples have been provided for simplicity but a large number of variations can be readily created. More complex fractals can be generated by applying more than one generator. For example, a new generator may be applied at each cycle of replacing each segment of the fractal being created.

The density of the generated curve can be represented by a parameter called fractal dimension. The fractal dimension, D, for the Koch curves is defined by the equation $$D = \frac{\log(N)}{\log(1/r)}$$

In the example of FIG. 6D, the fractal dimension is $$D = \frac{\log(8)}{\log(4)} = 1.5$$

A fractal is comprised of an infinite number of applications of the generator. The appearance of the fractal is thereby determined by the resolution that is selected for viewing the fractal. As a fractal is viewed at higher levels of detail, correspondingly greater levels of detail of the fractal are revealed. The infinite resolution of the fractal creates a theoretically infinitely long perimeter for a fractal having a finite area. By contrast, a physical embodiment of a fractal shape has a finite perimeter due to the finite resolution limits of the processes used to create the fractal. The large perimeter of fractal shapes in a given area, make fractals an ideal model for defining the shapes of conductive plates used in lateral flux capacitors.

Figure 8A:
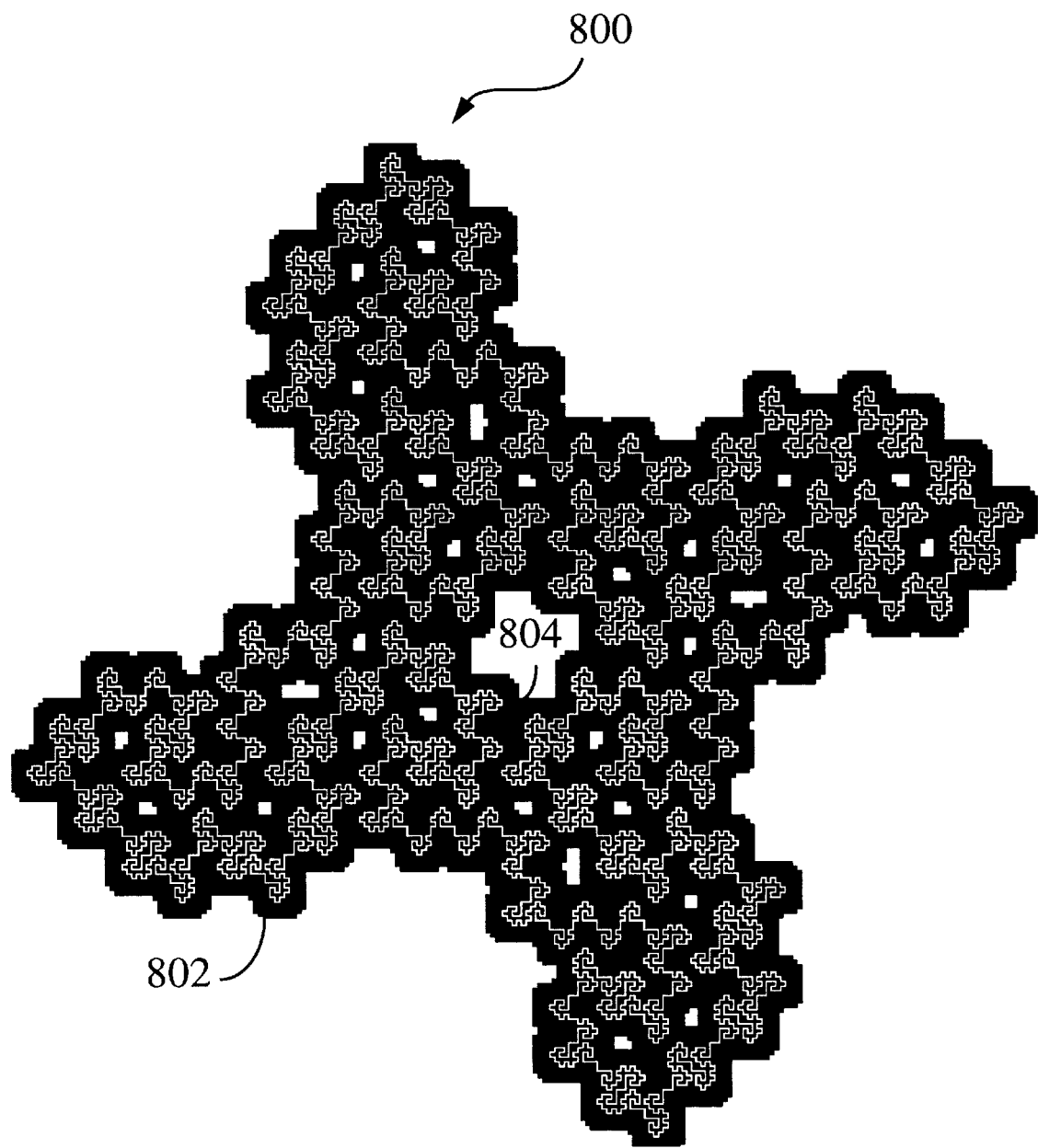
FIG. 8A illustrates a Koch Island lateral flux fractal capacitor 800 according to one embodiment of the present invention.
Figure 8B:
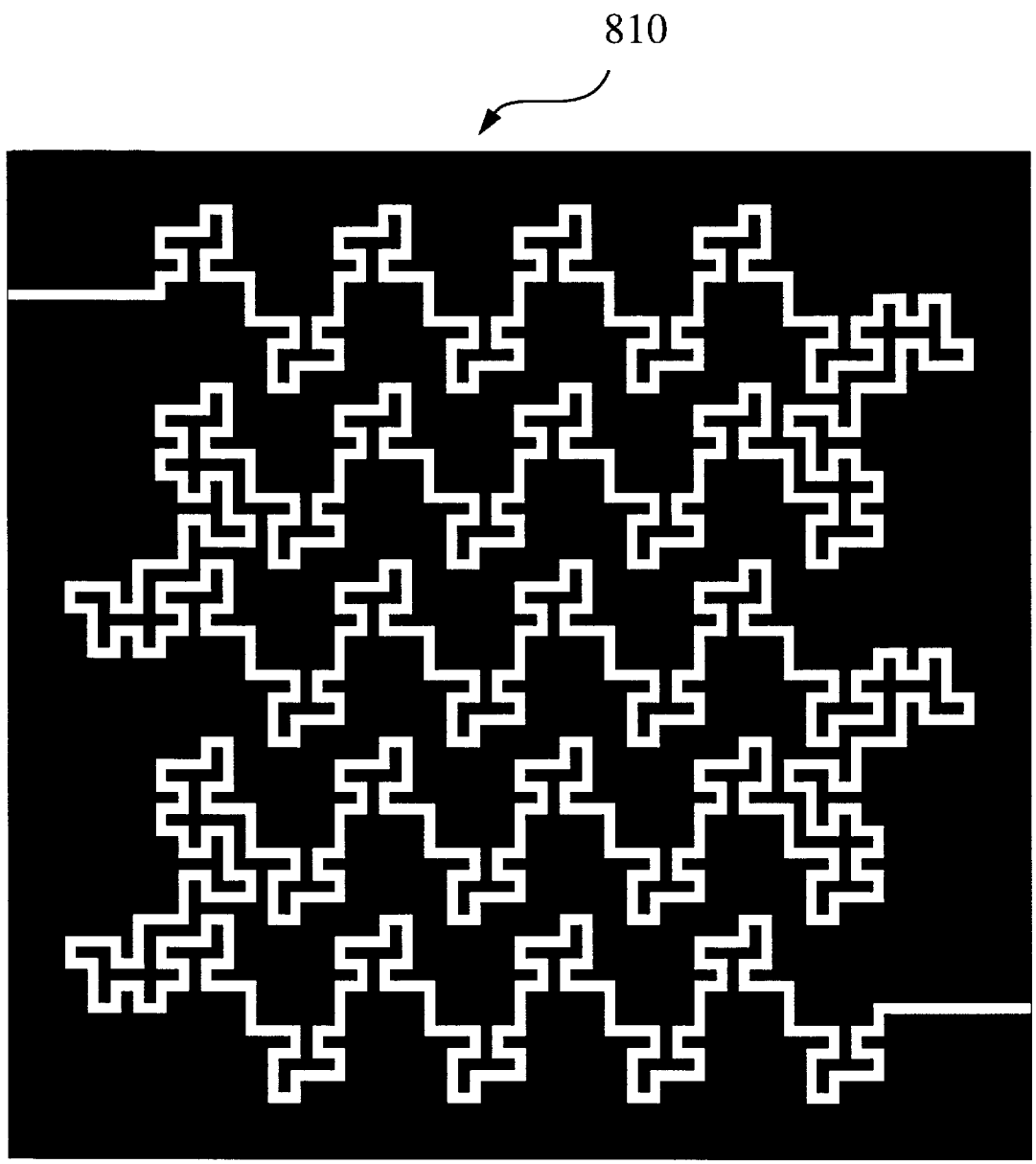
FIG. 8B illustrates a Minkowski Sausage lateral flux fractal capacitor 810 according to one embodiment of the present invention.

A wide variety of different families of fractals can be used to generate the shapes for capacitor plates to create lateral flux capacitors according to the present invention. Two fractal families that are particularly well suited for forming lateral flux capacitor conductive plates are the Koch Islands family and the Minkowski Sausage family. Minkowski Sausages are created using an initiator and a generator as is done for Koch Island fractals, however the initiator for Minkowski Sausages is an open curve, whereas the initiator for Koch Islands fractals is a closed curve. An example of an open curve is illustrated in FIG. 6D, where it is shown as a generator. Using a closed curve causes one capacitor plate to surround the other capacitor plate on a given metal layer, as illustrated in the Koch Islands fractal capacitor 800 in FIG. 8A. Whereas an open curve initiator creates fractal plates that each have exposed edges, as illustrated in the Minkowski Sausage fractal capacitor 810 in FIG. 8B. Minkowski Sausage fractal plates thereby allow access to both plates on the same metal layer. One advantage of the Koch Islands and Minkowski Sausage fractals is that they provide an infinite number of shapes for the capacitor. With these fractals it is also possible to shape the total area of the fractal to fit integrated circuit layout requirements. To efficiently use the area of the die in an integrated circuit layout, capacitors are often shaped to match spaces left open by other sections of the circuit. Capacitors may therefore be placed in "L" shaped spaces, long rectangles, or other more irregular shapes. Modifying the initiator in the fractal varies the shape of the resulting fractal. The relationship between the shape of the initiator and the resultant fractal is complex. Relationships between the initiator and the resultant fractal shape can be observed by creating numerous iterative graphs using a fractal layout simulator. Alternatively, software can be developed to allow a user to specify parameters of the resultant shape of the fractal, and a computer can be used to generate an appropriate fractal to satisfy these parameters. Many integrated circuit layout generators only accept horizontal and vertical lines. Fractals allow one to create sophisticated layouts using the comparatively limited graphics capabilities of conventional layout tools.

Figure 7A:
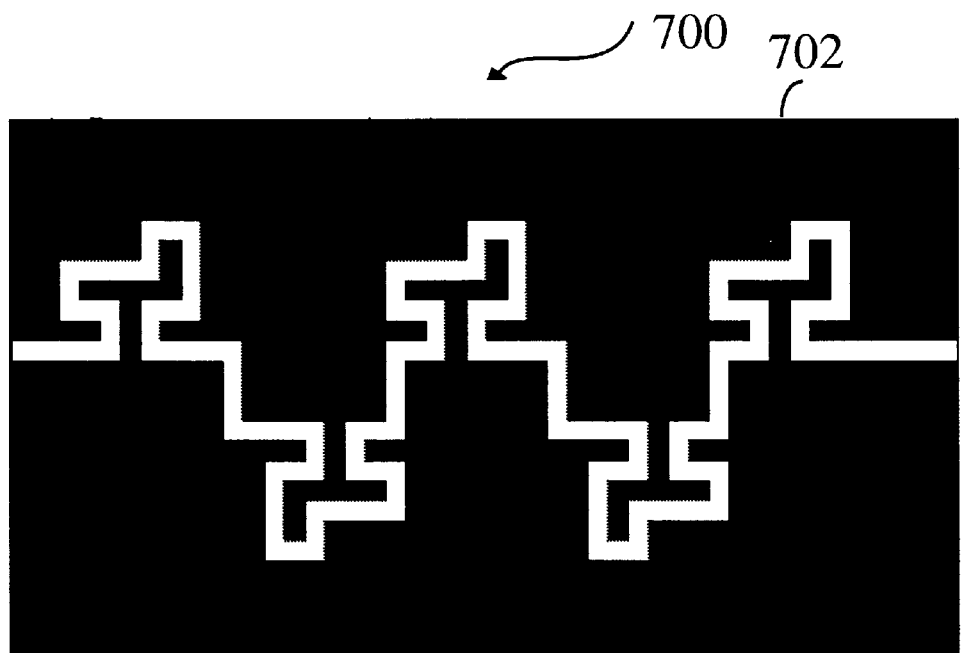
FIG. 7A illustrates a lateral flux fractal capacitor 700 according to one embodiment of the present invention.
Figure 7B:
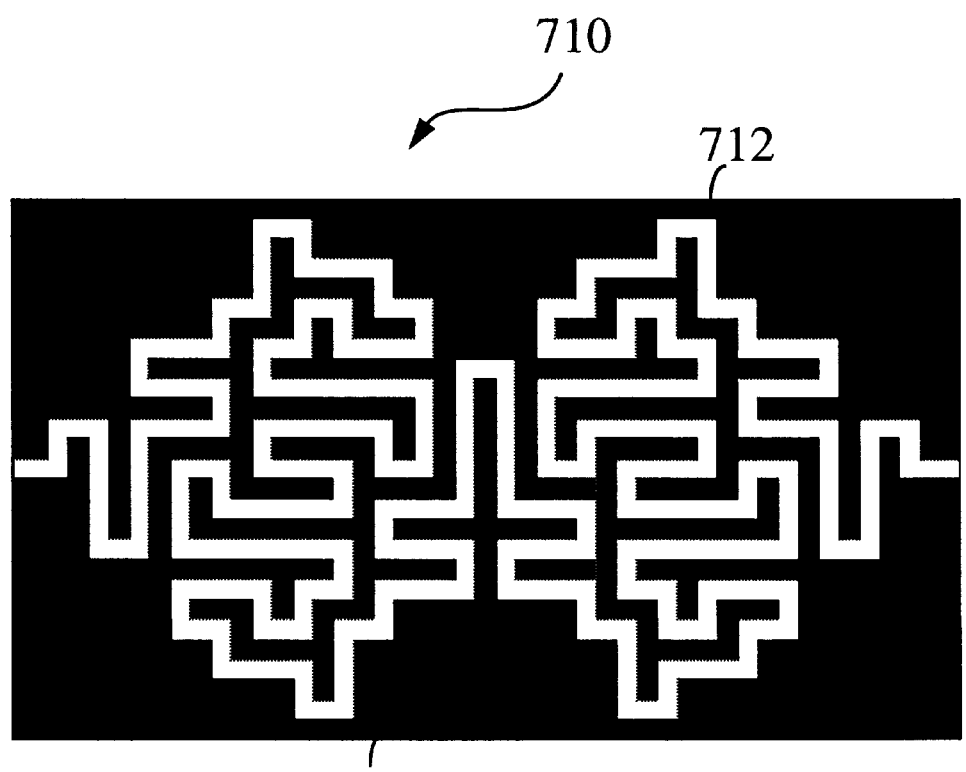
FIG. 7B illustrates a lateral flux fractal capacitor 710 having a higher fractal dimension than capacitor 700 according to one embodiment of the present invention.

FIG. 7A illustrates a lateral flux fractal capacitor 700 according to one embodiment of the present invention. A first conductive component of the capacitor is formed by region 702. A second conductive component of the capacitor is formed by region 704. The common edge of the regions 702 and 704 comprises a long fractal shaped region. The term fractal as used herein includes the mathematical form of fractals, as well as physical models of all or part of a fractal which only approximate the complexity of a fractal to a finite level of resolution. The elongated nature of this edge provides a high capacitance per unit area. FIG. 7A only illustrates a single metal layer, however, a plurality of metal layers can be stacked to further increase the capacitance. A further example of a lateral flux fractal capacitor is illustrated in FIG. 7B. The FIG. 7B capacitor 710 uses a fractal having a higher fractal dimension D. The higher fractal dimension produces a more complex fractal edge between the two conductive component regions. The generally larger widths of the metal sub-regions in capacitor 700 provide a lower parasitic resistance than capacitor 710, with the trade off that capacitor 710 provides greater capacitance per unit area than capacitor 700.

Designing Fractal Capacitors

Figure 9:
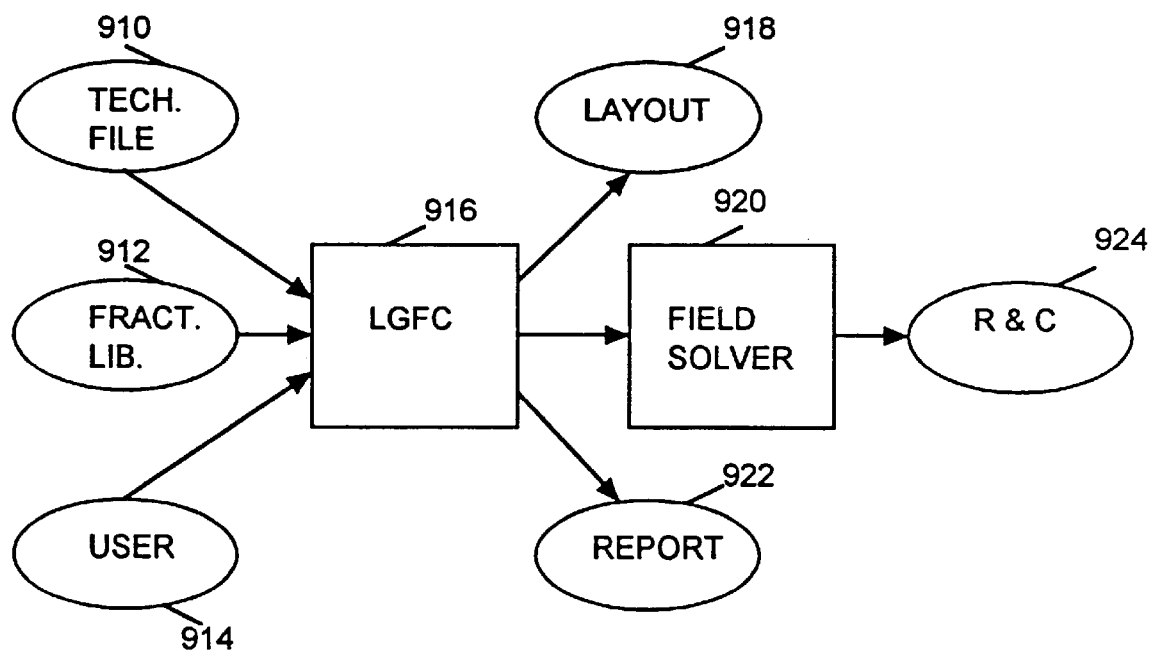
FIG. 9 illustrates the process of designing fractal capacitors according to one embodiment of the present invention.

FIG. 9 illustrates the process of designing fractal capacitors according to one embodiment of the present invention. The complex shapes of the fractal edges of the lateral flux capacitor plates makes simulators and electric field solvers important tools in the design process. The Layout Generator for Fractal Capacitors (LGFC) 916 comprises a computer system to facilitate the fractal capacitor design process. The inputs to LGFC 916 are technology file 910, fractal library 912, and user defined parameters 914. Technology file 910 provides all of the parameters that characterize the semiconductor manufacturing process to be used to fabricate the fractal capacitor. Technology file 910 includes such details as the number and types of metal layers, the minimum horizontal spacing, sheet resistances, and numerous other details, as is known by those of ordinary skill in the art. Fractal library 912 is comprised of a library of fractal families and fractal shapes that can be used for lateral flux capacitor plates. The fractal library can be used to generate new fractal shapes as well as to store newly generated fractal shapes. The fractal library is readily modifiable by a user to provide design flexibility.

For Koch Islands and Minkowski Sausage fractals, the fractal dimension D determines the degree of complexity of the fractal. The fractal dimension can be defined to be a value between 1 and 2. A higher fractal dimension generates a more complex fractal with more edge/length segments. Consequently capacitor plates comprising fractals with a higher fractal dimension provide higher capacitance per unit area. However, the increase in complexity of the shape of the capacitor plate also increases the parasitic resistance of the capacitor. A user can generate a wide range of fractal shapes by varying the fractal parameters M, N, and r. The initiator shapes are defined by defining the position of each vertex. For example, a code can be used as follows:

0=right

1=up

2=left

3=down.

To define an initiator, start from one vertex and move around the curve, listing the directions of segments and inserting the appropriate code. For example for the square illustrated in FIG. 6C the directions are right up left down. The code for the square is then "0123." Similarly for the cross illustrated in FIG. 6E the code is "010303232121." Generators are defined using the same coding scheme.

In addition to the fractal parameters, a user also provides other input parameters such as the desired minimum metal trace width. The minimum metal trace width is an important parameter in determining the resistance of the capacitor. LGFC 916 can be further enhanced to generate fractals based on more limited user input. For example, a user may just specify the desired capacitance, the maximum resistance, the total available area, the shape of the available area for the capacitor, and the minimum trace width. From this information LGFC 916 would then iteratively try different values of M, N and r to generate a fractal to meet the user specified design parameters.

With all of these inputs LGFC 916 generates a fractal layout 918 for capacitor plates to meet the design parameters specified by the user. LGFC 916 has been implemented to generate layouts in a variety of formats including, for example, MAGIC, CIF, Maestro and Rose. LGFC 916 also generates an output file that is compatible with a field solver 920. The complicated shapes of the capacitor plates generally require a field solver to determine the capacitance of the capacitor. Field solvers are widely available, examples of field solver systems include FastCap and Maxwell. Field solver 920 then provides a resistance and capacitance value for the fractal capacitor layout. A general guide for the relationship between perimeter and the fractal capacitor parameters is given by the proportionality relationship:

$$P \propto \frac{(\sqrt{A})^D}{(w+s)^{D-1}}$$

where w is the minimum width of the metal, s is the minimum spacing between two adjacent strips, A is the area of the fractal capacitance, and D is the fractal dimension.

LGFC 916 also generates a report 922 which provides the parameters of the fractal capacitor including the area, the minimum dimension and other parameters.

Fabrication

Fractal capacitors can be fabricated using standard semiconductor manufacturing processes. For example in a standard CMOS process, two metal layer fractal capacitors can be fabricated using aluminum metal layers and silicon dioxide dielectric. Polysilicon layers may also be used to form the conductive plates of the capacitor. As is known by those of ordinary skill in the art, there are a wide variety of semiconductor processes available which use a large number of different metal and dielectric materials, and also provide a range of different numbers of metal layers.

The minimum dimension of the fabrication process should be small enough to provide significant lateral fields. For most applications lateral fields between metal traces generally start to become significant in approximately a 0.5 $\mu$m or 1 $\mu$m process depending upon the application. Technological developments continue to reduce the minimum dimensions of fabrication processes, for example 0.18 $\mu$m processes are currently being used. As the minimum dimension continues to be reduced the lateral flux based capacitance that can be provided will continue to increase because capacitance is inversely proportional to the distance between adjacent plates. By contrast, the vertical distance between integrated circuit layers has changed little in recent years. Therefore, the advantages provided by lateral flux capacitors over conventional vertical flux capacitors are likely to grow as further technological advancements are made. One limiting theoretical factor on the spacing between capacitor plates is the breakdown voltage of the dielectric between the plates. For example, silicon dioxide dielectric has a breakdown voltage of $2 \times 10^6$ V/cm. Therefore the theoretical minimum spacing between conductive plates of a capacitor with a silicon dioxide dielectric is at least approximately 5 nm. A further potential limiting factor at dimensions in the 5 nm range is tunneling which would cause leakage across the capacitor.

Although a specific embodiment of the invention has been provided, modifications can be made without departing from the invention. For example, other metal layers and dielectrics can be used to form lateral flux capacitors, and other families of fractals may be used to shape the capacitor plates.

The foregoing description of specific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the claims appended hereto and their equivalents.

What is claimed is:

1. An integrated circuit capacitor comprising:
    a first conductive region in a first circuit layer having at least one edge of a predetermined configuration;
    a second conductive region in said first circuit layer having at least one edge of a predetermined complimentary configuration;
    said at least one edge of said first conductive region and said at least one edge of said second conductive region being spaced a predetermined distance apart with a first dielectric region between said first conductive region edge and said second conductive region edge so as to form a linear capacitor,
    a third conductive region in a second circuit layer having at least one edge of a predetermined configuration, said third conductive region coupled to said first conductive region;
    a fourth conductive region in said second circuit layer having at least one edge of a predetermined complimentary configuration, said fourth conductive region coupled to said second conductive region;
    a second dielectric region between said third conductive region and said fourth conductive region;
    a third dielectric region between said first circuit layer and said second circuit layer such that a total capacitance for said integrated circuit capacitor comprises lateral flux between said first conductive region and said second conductive region, lateral flux between said third conductive region and said fourth conductive region, vertical flux between said first conductive region and said fourth conductive region, and vertical flux between said second conductive region and said third conductive region.

2. The integrated circuit capacitor of claim 1 further comprising at least three circuit layers, each of said circuit layers comprising two conductive regions, said conductive regions being cross-coupled to conductive regions in adjacent circuit layers.

3. The integrated circuit capacitor of claim 2 further comprising six circuit layers.

4. The integrated circuit capacitor of claim 1 wherein
    said first conductive region further comprises a plurality of rows, each of said rows comprising a plurality of sub-regions, all of said sub-regions in each of said rows coupled to one of a first plurality of single strips;
    said second conductive region further comprises a plurality of rows, each of said rows comprising a plurality of sub-regions, all of said sub-regions in each of said rows coupled to one of a second plurality of single strips;
    said third conductive region further comprises a plurality of rows, each of said rows comprising a plurality of sub-regions, all of said sub-regions in each of said rows coupled to one of a third plurality of single strips;
    said fourth conductive region further comprises a plurality of rows, each of said rows comprising a plurality of sub-regions, all of said sub-regions in each of said rows coupled to one of a fourth plurality of single strips; and
    wherein each of said first conductive region rows is adjacent to one of said second conductive region rows, and each of said third conductive regions rows are adjacent to one of said fourth conductive region rows such that said first conductive region's sub-regions create lateral flux regions with said second conductive region's sub-regions and said third conductive region's sub-regions create lateral flux regions with said fourth conductive region's sub-regions along at least three edges of said first conductive region's sub-regions.

5. The integrated circuit capacitor of claim 4 further comprising at least three circuit layers, each of said circuit layers comprising two conductive regions, said conductive regions being cross-coupled to conductive regions in adjacent circuit layers.

6. The apparatus of claim 4 wherein said integrated circuit capacitor is further comprised of an array comprising a plurality of unit cells.

7. The integrated circuit capacitor of claim 1 wherein said predetermined distance between said first conductive region edge and said second conductive region edge comprises less than 0.4 m and greater than 5 nm.

8. An integrated circuit capacitor comprising:
 a first conductive region in a first circuit layer having at least one fractal edge comprising an approximation of a component of a fractal;
 a second conductive region in said first circuit layer having at least one fractal edge comprising a complimentary approximation of said component of said fractal;
 said at least one fractal edge of said first conductive region and said at least one fractal edge of said second conductive region being spaced a predetermined distance apart with a dielectric between said first conductive region fractal edge and said second conductive region fractal edge so as to form a linear capacitor,
 a third conductive region in a second circuit layer having at least one edge of a predetermined configuration, said third conductive region coupled to said first conductive region;
 a fourth conductive region in said second circuit layer having at least one edge of a predetermined complimentary configuration, said fourth conductive region coupled to said second conductive region;
 a second dielectric region between said third conductive region and said fourth conductive region;
 a third dielectric region between said first circuit layer and said second circuit layer such that a total capacitance for said integrated circuit capacitor comprises lateral flux between said first conductive region and said second conductive region, lateral flux between said third conductive region and said fourth conductive region, vertical flux between said first conductive region and said fourth conductive region, and vertical flux between said second conductive region and said third conductive region.

9. The integrated circuit capacitor of claim 8 wherein said fractal is generated using an initiator.

10. The integrated circuit capacitor of claim 9 wherein said fractal is a Minkowski Sausage fractal generated using said initiator and a generator.

11. The integrated circuit capacitor of claim 10 wherein said initiator comprises a cross.

12. The integrated circuit capacitor of claim 9 wherein said fractal is a Koch Islands fractal generated using said initiator and a generator.

13. The integrated circuit capacitor of claim 8 further comprising at least three circuit layers, each of said circuit layers comprising two conductive regions, said conductive regions being cross-coupled to conductive regions in adjacent circuit layers.

14. The integrated circuit capacitor of claim 8 wherein said predetermined distance between said first conductive region fractal edge and said second conductive region fractal edge comprises less than 0.4 m and greater than 5 nm.

15. An integrated circuit capacitor comprising:
 a first conductive region in a first circuit layer having at least one fractal edge comprising an approximation of a component of a fractal generated using an initiator;
 a second conductive region in said first circuit layer having at least one fractal edge comprising a complimentary approximation of said component of said fractal;
 said at least one fractal edge of said first conductive region and said at least one fractal edge of said second conductive region being spaced a predetermined distance, less than 0.4 $\mu$m and greater than 5 nm, with a dielectric between said first conductive region fractal edge and said second conductive region fractal edge so as to form a linear capacitor.

16. The integrated circuit capacitor of claim 15 wherein said fractal is a Minkowski Sausage fractal generated using said initiator and a generator.

17. The integrated circuit capacitor of claim 15 wherein said fractal is a Koch Islands fractal generated using said initiator and a generator.

* * * * *